United States Patent [19]

Belt et al.

[11] Patent Number: 5,055,445

[45] Date of Patent: Oct. 8, 1991

[54] METHOD OF FORMING OXIDIC HIGH $T_c$ SUPERCONDUCTING MATERIALS ON SUBSTANTIALLY LATTICE MATCHED MONOCRYSTALLINE SUBSTRATES UTILIZING LIQUID PHASE EPITAXY

[75] Inventors: Roger F. Belt, Morristown; John B. Ings, Boonton, both of N.J.

[73] Assignee: Litton Systems, Inc., Lexington, Mass.

[21] Appl. No.: 411,779

[22] Filed: Sep. 25, 1989

[51] Int. Cl.$^5$ .............................................. C30B 19/02
[52] U.S. Cl. ...................................... 505/1; 505/729; 156/621; 156/622; 156/662; 423/593
[58] Field of Search ................... 156/621, 622, 623 R, 156/634; 423/593; 505/1, 729

[56] References Cited

U.S. PATENT DOCUMENTS 4,824,826  4/1989  Damento et al. ....................... 505/1
4,865,681  9/1989  Mattes ....................... 156/DIG. 64

OTHER PUBLICATIONS

Katsui et al., "Single Crystal Growth of Ba(Pb,Bi)O$_3$ from Molten KCl Solvent", Japan Journal of Applied Physics, vol. 21, 1982, pp. L157-L158.

Yue et al., "YBa$_2$Cu$_3$O$_x$ Films Grown by the Liquid Phase Epitaxial Technique", High Temperature Superconductors II, extended abstracts, M.R.S., Apr. 5-9, 1988, pp. 85-88.

Takeya et al. (I), "Preparation of High T$_c$-Bi-Sr-Ca-Cu-O Films on MgO Substrates" by L. P. E. Japanese Journal of Applied Physics, vol. 25, No. 2, Feb. 1989, pp. L229-L232.

Hidaka et al., "Anisotropic Properties of Superconducting Single Crystals . . ." Pres. 18th Conf. on Low Temp. Physics Japanese Journal of Applied Physics, vol. 26, (1987) supplement 26-3.

Morris et al., "Preparation of High-Quality Single Crystals of 90K Superconducting YBaCuO", Extended Abstracts, High Temp. Superconductors, M.R.S., Apr. 1988 pp. 43-56.

Balestrino et al., "Growth of Textured Films of BiSrCaCuO from KCl Solution" Applied Physics Letters, vol. 54(20), May 15, 1989, pp. 2041-2042.

Takeya et al. (II), "Preparation of High-T$_c$Bi-Sr-CaCu-O Films on MgO Substrates by (SEE)," Japanese Journal of Applied Physics, vol. 28, No. 9, Sep. 1989, pp. L1571-L1574.

Kawabe et al., "Single Crystal Growth of Superconducting Layered Perovskite Metal Oxides", Extended Abstracts, High Temp. Superconductors, M.R.S. Apr. 1987, pp. 251-252.

*Primary Examiner*—Robert Kunemund
*Attorney, Agent, or Firm*—Michael H. Wallach; Robert F. Rotella

[57] ABSTRACT

A method of forming an epitaxial layer of an oxidic high $T_c$ superconductor on a substantially lattice matched monocrystalline substrate is described. The film is formed by liquid phase epitaxy utilizing a melt containing a nutriment composed of oxides of each element of the oxidic superconductor and a non-oxidic flux for such oxides. The preferred flux is an alkali halide. The monocrystalline substrate on which the film is dsposited is introduced into the melt and an epitaxial layer of oxidic superconductor is formed on the substrate.

45 Claims, No Drawings

METHOD OF FORMING OXIDIC HIGH $T_c$ SUPERCONDUCTING MATERIALS ON SUBSTANTIALLY LATTICE MATCHED MONOCRYSTALLINE SUBSTRATES UTILIZING LIQUID PHASE EPITAXY

BACKGROUND OF THE INVENTION

This invention relates to the field of superconducting thin film devices. Such devices comprise a superconductor film formed on a monocrystalline substrate. In accordance with the invention, superconductor film growth on lattice matched monocrystalline perovskite-type substrates is achieved utilizing liquid phase epitaxial (LPE) growth. Specifically, the invention relates to the discovery that high quality polycrystalline superconductor films with preferred orientation and monocrystalline superconductor films can be grown at enhanced growth rates on substantially lattice matched monocrystalline substrates by means of liquid phase epitaxy.

DESCRIPTION OF THE PRIOR ART

Oxide superconductors are a recent and highly developed class of superconducting materials. In 1986, Johannes Bednorz and Karl Müeller discovered the superconducting properties of barium-lanthanum-copper oxide ($Ba_xLa_{2-x}CuO_4$), which has a transition temperature ($T_c$) of about 35° K. In January of 1987, Paul C. W. Chu and Maw-Kuen Wu announced their discovery of a superconducting material with a transition temperature of about 95° K having the approximate composition $YBa_2Cu_3O_7$, which has come to be known as the 123 compound for its relative atomic proportions of yttrium, barium and copper. In addition to the 123 compound and its analog oxide superconductors with $T_c$'s around 85° K.–95° K., the class of high $T_c$ oxide superconductors includes, among others, Bi containing mixed oxides with $T_c$'s around 85° K.–110° K. and Tl compounds with $T_c$'s from about 85° K. up to 125° K. The Bi and Tl materials are members of a general class of materials of type $A_2M_2Ca_{n-1}Cu_nO_{2n+4}$ where n=1–3, A=Bi, Tl and M=Sr, Ba. The 123 type superconductor properties are very sensitive to oxygen stoichiometry while the others are not.

Films of the foregoing High $T_c$ superconductor materials, that is, materials having a $T_c$ of about 35° K. and above, and especially materials having a $T_c$ on the order of 123 superconductors or greater have been formed using single or multiple target RF magnetron sputtering, electron beam codeposition, high temperature pyrolysis, organic precursors, laser ablation from polycrystals, thermal evaporation, molecular beam epitaxy, plasma and thermal spraying, chemical vapor deposition, vapor transport and sol-gel solution methods. It is a known principle of epitaxial film growth that similar crystal structure and nearly matching lattice constants provide the most favorable situation for high quality film deposition. (See L. I. Maissel and R. Glang, Editors, "Handbook of Thin Film Technology", I. H. Khan, Chapter 10, McGraw Hill, New York, 1970).

Even though high-quality single crystals of High $T_c$ superconductors have been prepared using the above-enumerated procedures, the method of the present invention allows for film deposition of oxidic superconductors from a melt by solution growth of oxide superconductor films. The method of the present invention and the attendant advantages thereof have never been appreciated by the art.

Two other investigators have worked in what they term liquid phase epitaxial growth of $YBa_2Cu_3O_{7-x}$ and $Bi_2Sr_2Ca_1Cu_2O_8$ film (ref. papers F5.121 by A. S. Yue and C. S. Yang and paper F5.122 Huang, R. S. Liu, J. J. Chu and P. T. Wu) both papers presented at the 1988 fall meeting of The Materials Research Society, Nov. 28–Dec. 3, 1988 in Boston, MA.). This work differs from the present work in that in their work no flux was used to liquify the viscous melt. In those cases substrates were placed in very viscous pastes of $Y_2O_3$-BaO-$Cu_2O$ in the case of the growth of $YBa_2Cu_3O_{7-x}$ and $Bi_2O_3$-SrO-CaO-$Cu_2O$ pastes in the case of the growth of $Bi_2Sr_2Ca_1Cu_2O_8$. As the pastes were cooled, some epitaxial growth occurred but these techniques are not adaptable to the growth of high quality films. In addition, these investigators used MgO substrates that are neither lattice matched nor even of the same crystal structure. Their epitaxial growth therefore was limited to very small areas circa 100 μm on a side. Extensive cracking of thin films resulted from the use of inappropriate substrates.

The present invention is based on the discovery that solution growth of films by liquid phase epitaxy (LPE) which has been used in the formation of single crystal semiconductor and magnetic films can also be used for the formation of oxide superconductor films. The method of the present invention finds particular application for high $T_c$ films, those films having a $T_c$ of about 35° K. or higher.

SUMMARY OF THE INVENTION

The present invention relates to an improved method of forming an epitaxial layer of an oxidic high $T_c$ superconductor on a substantially lattice matched monocrystalline substrate. The method of the present invention, involves film formation utilizing liquid phase epitaxy comprising the steps of forming a melt comprising a nutriment composed of oxides of each element of said oxidic superconductor and a non-oxidic flux for said oxides. The substrate on which the film is to be deposited is introduced into the melt and an epitaxial layer of oxidic superconductor is deposited on the substrate.

The preferred flux is an alkali halide. Most preferably the flux is comprised of one or more alkali halides selected from the group consisting of KCl, KF, NaCl, NaF and combinations thereof. Of this latter group the potassium salts are the most preferred flux.

The melt is preferably inert to Platinum, non-wetting and has a viscosity of about 0.5 to about 10 centipoise measured at growth temperature.

Among the oxidic superconductor compositions that may be applied utilizing the method of the present invention are the 123 and 2212 superconductors and their analogs.

In one embodiment of the present invention, the epitaxial layer of an oxidic, perovskite-related superconductor is formed on a substantially lattice matched monocrystalline perovskite-type substrate by immersing the substrate into a melt comprising a nutriment comprised of oxides of each element of the oxidic superconductor and an alkali halide flux for said oxides. The melt is cooled to form a film consisting of the oxidic superconductor on the substantially lattice matched surface of the substrate. After a film of desired thickness is formed, the substrate is withdrawn from the melt. The withdrawn substrate has an epitaxial film of oxidic superconductor formed thereon and the film has a residue of flux thereon. The residue of flux is then removed from the film.

The flux is preferably comprised of an alkali halide most preferably an alkali halide selected from the group consisting of KCl, KF, NaCl, NaF and combinations thereof. Any oxidic superconductor film, such as the films of 123 and 2212 superconductor compounds and analogs thereof, may be formed in accordance with the method of the present invention.

Among the suitable substrates are the orthogallates, and in particular, rare earth orthogallates such as lanthanum orthogallate and the rare earth orthogallates of the following formula:

$$R_xLa_{1-x}GaO_3$$

wherein R is a rare earth element of smaller ionic radius than La and wherein x has a value of from 0.001 to 0.5.

Yet another aspect of the present invention relates to a new melt for liquid phase epitaxial growth of oxidic superconductor films. The melt comprises a nutrimetn comprised of oxides of each element of the selected oxidic superconductor. Such oxides are dissolved in a flux which does not react with any of the oxides at the growth temperature of oxidic film and wherein the primary phase to crystallize out on cooling to effect film growth is the phase of the oxidic superconductor.

The flux of the melt is preferably a non-oxidic flux comprised of one or more salts, the cations of which has a valence of 1 or 4.

Most preferably, the flux is an alkali halide or a mixture of alkali halides, preferably fluorides and/or chlorides of sodium and/or potassium.

The nutriment suitably is comprised of oxides of the elements of any oxidic superconductor inclusive of 123 and 2212 type superconductors and their analogs and the oxide superconductors described by A. W. Sleight in "Chemistry of High-Temperature of Superconductors," Science, 242, 1519 (1988).

DETAILED DESCRIPTION OF THE INVENTION

The Substrate

The single crystal substrates particularly suited for use in the present invention are rare earth orthogallates having substantially the same lattice constant as the films that are to be grown. Stated otherwise, in order to achieve deposition of a high quality, low defect superconductor film by LPE in accordance with the present invention, the lattice mismatch ($\Delta a_o$) between substrate and the superconductor film must conform to the following requirement:

$$\Delta a_o \leq \frac{.03}{\sqrt{h}}$$

where h is the film thickness in um and $\Delta a_o$ is the lattice constant mismatch in the plane of the film expressed in Å.

One such suitable substrate is monocrystalline LaGaO$_3$ which can be grown from a pure melt by the Czochralski method. Monocrystalline lanthanum orthogallate substrate and the method of making lanthanum orthogallate in both pure and doped form is described in commonly owned, copending application Ser. No. 164,235, filed Mar. 4, 1988, the disclosure of which is incorporated herein by reference thereto. The substrate of the present invention is suitably oriented by X-ray diffraction and sliced and polished preferably to within $\pm 0.25°$ of the desired orientation. Although deviation of $\pm 1°$ can be tolerated, the film quality is diminished. The surfaces may be sliced and polished in accordance with the various processes known to the art for this purpose and the polished surface of the substrate of the present invention should have a surface finish corresponding to that required for other forms of known deposition such as sputtering, electron beam codeposition, molecular beam epitaxy, etc.

The surface of the wafer upon which the film is deposited, should not contain scratches, voids, dislocations or inclusions of such size and/or number to disrupt the continuity or integrity of the film applied with resultant degradation of superconductor properties of the film. The surface finish should meet or exceed the industry standard of no more than 5 micron-size defects (scratches, voids, inclusions or dislocations) per square centimeter. Generally meeting the industry standard finish provides a suitable surface for application of an oxidic superconductor film in accordance with the present invention.

In accordance with the present invention, the crystallographic orientation of the substrate is chosen to substantially match the lattice constant of the superconducting films. There are two suitable orientations for LaGaO$_3$ substrates for the growth of YBa$_2$Cu$_3$O$_7$ films. If a (001) orientation is selected, the Ga-O planes of LaGaO$_3$ substrate have a lattice spacing of about 3.894 Å. The crystal structure is that of a distorted perovskite in that the plane angles of 89.32° and 90.68° differ from the 90° of the perovskite structure. The (001) or Cu-O planes of the YBa$_2$Cu$_3$O$_7$ film have an a and b lattice spacing of 3.820 Å and 3.892 Å respectively, which match the (001) planes of LaGaO$_3$ fairly well. Where LaGaO$_3$ substrates of (110) orientation are selected, a lattice spacing of 3.892 Å and c/2 = 3.885 Å is matched to the c/3 = 3.896 Å and 3.82 or 3.89 Å spacings of the YBa$_2$Cu$_3$O$_7$ film. In both cases the lattice match of the film to LaGaO$_3$ is better than that for the commonly used a=b=c=3.905 Å SrTiO$_3$. For the growth of Bi$_2$Sr$_2$Ca$_1$Cu$_2$O$_8$ on an (001) oriented LaGaO$_3$ substrate, the lattice match is not quite as good as for YBa$_2$Cu$_3$O$_7$. The a and b lattice constants for Bi$_2$Sr$_2$Ca$_1$Cu$_2$O$_8$ are about 3.82 Å. This would provide a mismatch which is marginal for true epitaxial growth. What is needed is a smaller lattice constant perovskite substrate. Several alternate substrate choices exist. First, smaller ions such as Gd can be added to the crystal structure to dilute the large size of the La. Substrates such as La$_{0.9}$Gd$_{0.1}$GaO$_3$ are suitable for this purpose. Alternatively, the lattice constant of LaGaO$_3$ may be shrunk by the partial replacement of Ga with the smaller Al ion. Yet another alternative for matching the lattice of the substrate within acceptable limits with the superconducting film involves the use of other rare earth orthogallates.

Table I, set forth immediately below, describes the a and b lattice constants of the rare earth orthogallates near in size to GdGaO$_3$ and also sets forth the calculation of the a-b plane mismatch of Bi$_2$Sr$_2$Ca$_1$Cu$_2$O$_8$ grown on (001) rare earth orthogallates. The lattice constants of GdGaO$_3$ with a=3.84 Å and b=3.803 Å match within appropriate limits the a=b=3.817 Å of Bi$_2$Sr$_2$Ca$_1$Cu$_2$O$_8$ superconducting film. The maximum mismatch is ±0.023 Å. According to the rule of thumb for lattice mismatch, a 1.7 μm film of $Bi_2Sr_2Ca_1Cu_2O_8$ can be grown on $GdGaO_3$. As this rule is conservative, a 3 μm film could easily be grown by LPE.

TABLE I

Calculation of the a-b plane mismatch of $Bi_2Sr_2Ca_1Cu_2O_8$ grown on (001) rare earth orthogallates.

| Substrate | $Bi_2Sr_2Ca_1Cu_2O_8$ a = b = 3.817 Å c = 30.6 Å Pseudo-cell | | Mismatch to $Bi_2Sr_2Ca_1Cu_2O_8$ | |
|---|---|---|---|---|
|  | a, Å | b, Å | a, Å | b, Å |
| $LaGaO_3$ | 3.888 | 3.884 | 0.071 | 0.067 |
| $PrGaO_3$ | 3.871 | 3.866 | 0.054 | 0.049 |
| $NdGaO_3$ | 3.865 | 3.855 | 0.048 | 0.038 |
| $SmGaO_3$ | 3.850 | 3.825 | 0.033 | 0.008 |
| $EuGaO_3$ | 3.847 | 3.814 | 0.030 | −0.003 |
| $GdGaO_3$ | 3.840 | 3.803 | 0.023 | −0.014 |
| $TbGaO_3$ | 3.833 | 3.789 | 0.016 | −0.028 |
| $DyGaO_3$ | 3.825 | 3.778 | 0.008 | −0.039 |
| $HoGaO_3$ | 3.813 | 3.768 | −0.004 | −0.049 |
| $ErGaO_3$ | 3.808 | 3.761 | −0.009 | −0.056 |

Data from Rare Earth Orthogallates, M. Marezio, J. P. Remeika, P. D. Dernier, Inorganic Chemistry 7, 1337 (1968).

For a single rare earth orthogallate, the best substrate match is $GdGaO_3$.

The class of substrates based on lanthanum orthogallate which has been discovered to readily grow from a pure melt along a predetermined crystallographic direction as previously noted, is particularly suited for use in the present invention and one embodiment of the present invention relates to the application of superconducting films by liquid phase epitaxy (LPE) onto monocrystalline lanthanum orthogallate substrates. Included in the class of suitable perovskite-type monocrystalline substrates are single crystals of the following formulae:

$$LaGa_{1-x}Sc_xO_3 \quad \text{1.}$$

$$LaGa_{1-x}Al_xO_3 \quad \text{2.}$$

$$LaGa_{1-x}In_xO_3 \quad \text{3.}$$

wherein x may be 0.001–0.5 and for most applications is 0.01–0.2.

The compositions in which either Sc, Al or In are substituted for Ga in the crystal structure allow for the manipulation of the lattice constant of the monocrystalline substrate; that is, such substitution can be used to "tune" the lattice unit cell.

Where it is desirable to increase the lattice constant in addition to, or as an alternative for, substitution of $Al^{3+}$ for $Ga^{3+}$ it is possible to use $In^{3+}$ in place of $Al^{3+}$. $Fe^{3+}$ should not be used because of its ferromagnetic properties.

Also included in the class of suitable perovskite-type monocrystalline substrates are single crystals of the following formula:

$$R_xLa_{1-x}GaO_3$$

wherein R is a rare earth element of smaller ionic radius than La and wherein x may be 0.001–0.5 and for most applications is 0.01–0.2.

In addition, the class of suitable perovskite-type monocrystalline substrates includes single crystals of the following formulae:

$$R_xLa_{1-x}Ga_{1-y}Al_yO_3$$

$$R_xLa_{1-x}Ga_{1-y}Sc_yO_3$$

$$R_xLa_{1-x}Ga_{1-y}In_yO_3$$

wherein R is a rare earth element of smaller ionic radius than La and wherein x and y may be the same or different and are within the range of from 0.001–0.5 and for most applications is 0.01–0.2.

The lattice constant of the lanthanum orthogallate substrates can be decreased by substituting rare earth elements of smaller ionic radii for La. The rare earth elements that can be substituted for La are: Ce, Pr, Nd, Pm, Sm, Eu, Gd, Tb, Dy, Ho, Er, Tm, Yb and Lu. Where a colorless substrate is desired then the rare earth elements/metals that can be substituted for La are Gd, Yb, Lu and Y.

The mixed single crystals particularly suitable as substrates for use in the present invention can readily be grown in dimensions greater than 1 cm in diameter and 10 cm in length and in boule sizes equivalent to those of the monocrystalline lanthanum orthogallate suitable for use as superconductor substrate in the method of the present invention.

The monocrystalline lanthanum orthogallate substrate may be formed by preparing a mixture of $La_2O_3$ and $Ga_2O_3$; heating said mixture to form a melt of uniform composition in a controlled atmosphere; and, cooling said melt to form a boule of monocrystalline lanthanum orthogallate. Preferably the mixture of $La_2O_3$ and $Ga_2O_3$ is stoichiometric.

Mixed monocrystalline lanthanum orthogallate is grown along a predetermined crystallographic direction by forming a mixture of $La_2O_3$, $Ga_2O_3$ and an oxide of the cation selected as a substitute for a portion of La and/or Ga in the crystal. The mixture is heated to form a melt of uniform composition in a controlled atmosphere; thereafter the melt is cooled to form the mixed monocrystalline lanthanum orthogallate. Preferably the mixture of $La_2O_3$, $Ga_2O_3$ and selected substitute oxide is stoichiometric.

The amounts of ingredients in the stoichiometric mixture can vary from the exact stoichiometric quantities calculated from the monocrystalline or mixed monocrystalline product. Variations of up to about ±5 percent can be tolerated without adversely affecting the desired oriented single crystalline product. Thus for purposes of calculating stoichiometric ratio variations of ±2 percent can be used.

The monocrystalline lanthanum orthogallate or mixed monocrystalline lanthanum orthogallate substrates particularly suitable as substrates for use in the present invention can be grown by the Czochralski method. This method comprises the steps of forming a mixture of $La_2O_3$ and $Ga_2O_3$ or $La_2O_3$, $Ga_2O_3$ and an oxide selected from the group consisting of Al, Ga, In, Y, rare earth elements of smaller diameter than La and mixture thereof, preferably in stoichiometric amounts; heating said mixture to form a melt of uniform composition in a controlled atmosphere; initiating growth of said crystal on nucleating means for holding and pulling said crystal from the melt; and pulling the crystal formed on the nucleating means. The nucleating means is preferably an oriented seed crystal, although it has been found that the nucleating means may be an inert material stable at the temperature of the melt, e.g. iridium. The controlled atmosphere for substrate formation may be inert, an oxidizing atmosphere or a reducing atmosphere.

The purity of the oxides that are mixed to form the melt for forming monocrystalline lanthanum orthogallate substrate material or mixed monocrystalline lanthanum orthogallate substrate material suitably is at least about 99.9%. Oxide purity of about 99.99% or greater is preferably used. Boules of a size of about 0.7 inch diameter or greater and 4 inch in length or larger are obtained and sizes of 1 inch or greater diameter and 5–6 inches in length or even larger are capable of being grown using a pure melt. Monocrystalline lanthanum orthogallate may be formed using a pure melt (a melt consisting essentially of $La_2O_3$ and $Ga_2O_3$) in sizes of at least one centimeter in diameter and 10 cm. in length. A substantially stoichiometric ratio of $La_2O_3$ and $Ga_2O_3$ is used to form a uniform pure melt for monocrystalline lanthanum orthogallate.

It is possible to obtain a monocrystalline product utilizing admixtures of lanthanum and gallium oxides outside the stoichiometric ratios required for lanthanum orthogallate formation but not necessarily with the same results; that is, variations in the refractive index and crystal quality may occur.

Also, mixed monocrystalline lanthanum orthogallate may be formed using a pure melt (a melt consisting essentially of $La_2O_3$ and $Ga_2O_3$ and an oxide selected from the group consisting of Al, Ga, In, Y, rare earth elements of smaller diameter than La and mixtures thereof) in sizes of at least one centimeter in diameter and 10 cm. in length. A substantially stoichiometric ratio of $La_2O_3$, $Ga_2O_3$ and other oxides is used to form a uniform pure melt for monocrystalline lanthanum orthogallate.

The oxide mix is suitably in powder form with oxide particle sizes typically used to form melts, e.g., 1–10 μm preferred.

It is possible to obtain a monocrystalline product utilizing admixtures of lanthanum, gallium and other selected oxides outside the stoichiometric ratios required for mixed single crystal lanthanum orthogallate formation. As in the case of monocrystalline lanthanum orthogallate, use of such admixtures will not necessarily produce the same results as when substantially stoichiometric mixtures are used.

The crystals of the lanthanum orthogallate and mixed lanthanum orthogallate are suitably formed at atmospheric conditions that are oxidizing although the stability of the melt is such that it is also possible to use inert atmospheric conditions. The use of an oxidizing atmosphere to suppress reduction of gallium oxide component of the mix is preferred.

Growth of monocrystalline lanthanum orthogallate or mixed monocrystalline lanthanum orthogallate, as previously noted herein, is suitably in the (001) and (110) orientations where superconductors of the formula $YBa_2Cu_3O_{7-x}$ are selected for the superconducting film; or, alternate orientations may be selected depending on the specific requirements of lattice matching between the substrate and selected superconducting material.

The lattice constant of the substrate, it should be pointed out, can also be adjusted by utilizing mixed single crystals of composition $LaGa_{1-x}Al_xO_3$ or $LaGa_{1-x}Sc_xO_3$, where $x = 0.001–0.2$. In such crystals, the lattice unit cell can be "tuned" by virtue of the smaller ($Al^{3+}$) or larger ($Sc^{3+}$) ionic radii.

To obtain the substrates used in the method of forming high $T_c$ superconducting materials on substantially lattice matched monocrystalline substrates of the present invention, the procedure indicated below can be used.

After the $LaGaO_3$ oriented single crystal boule is grown, the ends are cut off flat by a saw. The boule is then polished on its ends for a complete optical inspection by ordinary and laser light. Another 1 mm slice from the boule is taken to perform a chemical etch test for defects and lattice constant measurement by X-ray diffractometer. The boule is then ground to a cylinder by centerless grinding for round substrates or ground flat for square wafers. The boule is next mounted on a dop to perform an X-ray orientation to ±0.1°. The particular planes, e.g. (110) planes of $LaGaO_3$, are now parallel to each saw cut for a wafer. The boule is then completely cut into wafers on an inside diameter diamond wafering saw. Each wafer is about 1 mm thick for the rough cut. The wafers are mounted on metal blocks, lapped to flatness and parallelism by means of a planetary lapping machine, and then removed. Wafers are then given a chemical etch to remove all surface damage incurred by previous mechanical processes. The wafers are next polished by a Syton chemical-mechanical process to give a damage-free epitaxial growth surface. Wafers are then removed, inspected, cleaned, and ready for film deposition in accordance with the method of the present invention.

The following Examples A through D, inclusive, illustrate the growth of lanthanum orthogallate and mixed lanthanum orthogallate single crystals suitable for preparing orthogallate wafers of appropriate architecture for use in the present invention.

EXAMPLE A

Growth of $LaGaO_3$

A single crystal of lanthanum orthogallate ($LaGaO_3$) was grown in a furnace arrangement consisting of a 2×2 inch cylindrical iridium crucible supported by a zirconia tube and entirely surrounded by zirconia grog for thermal insulation. Additional insulation for the growing crystal was provided by a 3×3 inch cylindrical zirconia sleeve situated above and concentric to the crucible. Power for melting the oxides and maintaining the crystal diameter was provided by a 350 KHz induction generator supplying a 10 turn coil located external to a quartz tube which held the ceramic elements and crucible in place. The growth furnace was isolated from the ambient atmosphere by means of a water cooled metal enclosure.

A melt comprised of lanthanum orthogallate was established by introducing a stoichiometric mixture of 330.2 g of 99.99% purity lanthanum oxide and 189.8 g of 99.99% purity gallium oxide into the iridium crucible. The component oxides are purchased as free flowing microcrystalline solid powders in a size range of approximately 1–10 μm. Power to the crucible was increased until the contents were completely molten. In the absence of a lanthanum orthogallate seed, an iridium wire was then lowered into the melt in order to nucleate a crystal. Following initial crystallization, the wire was withdrawn at 1.25 mm per hour while rotating at 25 rpm. The entire melting and crystal growth procedure was conducted in a controlled atmosphere comprised of 99.5% $N_2$ flowing at 21 liter/minute and 0.5% $CO_2$ flowing at 0.1 liter/minute.

An oxidizing atmosphere was chosen to counteract the anticipated loss of gallium oxide through volatilization. Loss by this mechanism was found to be negligible, however. In addition, the melting point was found to be much lower than expected. The temperature of the melt was approximately 1700° C.

The lanthanum orthogallate, as observed, congruently melted at or very near its stoichiometric composition. X-ray powder diffraction confirmed that the crystallized phase was lanthanum orthogallate.

The size of the grown crystal was 22 mm diameter x 84 mm long, and its single crystal nature was confirmed by the appearance of well-defined spots in a Laue back reflection x-ray photograph. The axial orientation of the crystal was close to [110].

EXAMPLE B

Growth of LaGaO$_3$

After the growth of the initial crystal, where a substantial portion (37%) of the melt was crystallized and removed, a second crystal was grown under the same conditions as before. Oxide components equal to the composition of the grown crystal, i.e. 121.9 g of La$_2$O$_3$ and 70.1 g of Ga$_2$O$_3$, were intimately mixed and added to the crucible containing the residual solidified melt. The component oxides are purchased as free flowing microcrystalline solid powders in a size range of approximately 1–10 μm. The temperature of the growth station was increased until the entire crucible contents had melted. An iridium wire was then lowered into the melt and crystallization was conducted as before. The previous observations of a relatively low melting point and good melt stability were replicated. A substantial portion (36%) of the melt was again crystallized with no indication of changes in the crystallized phase associated with a deviating melt composition.

The crystal measured 19 mm in diameter and 102 mm in length and was confirmed to be a single crystal of (001) orientation by Laue X-ray back reflection.

An X-ray powder pattern confirmed the LaGaO$_3$ composition and lattice constants.

The above procedure of melt addition and regrowth is normally not attainable in other Ga$_2$O$_3$ containing systems, e.g. Gd$_3$Ga$_5$O$_{12}$, because of substantial deviations in composition brought about by Ga$_2$O$_3$ volatility.

EXAMPLE C

Growth of Mixed Crystals

Mixed single crystals are prepared by fixing the proportions of LaAlO$_3$ and LaGaO$_3$ in the starting compositions. Since both compounds have nearly an identical perovskite structure, the X-ray lattice constants in the mixed crystal are proportional to the amount of each component. An example is given in Table II where the measured lattice constants of pure LaAlO$_3$, LaGaO$_3$, and LaScO$_3$ are given. The calculated values for 50-50 mole % mixtures of LaAlO$_3$-LaGaO$_3$ and LaGaO$_3$-LaScO$_3$ are given. Other intermediate values are achieved in a similar manner.

TABLE II

| | Lattice Constants of Perovskites | | |
|---|---|---|---|
| Compound | a(Å) | b(Å) | c(Å) |
| LaAlO$_3$ | 5.356 | 5.356 | 7.600 |
| *LaAl$_{0.5}$Ga$_{0.5}$O$_3$ | 5.438 | 5.425 | 7.685 |
| LaGaO$_3$ | 5.519 | 5.494 | 7.770 |
| *LaGa$_{0.5}$Sc$_{0.5}$O$_3$ | 5.600 | 5.640 | 7.934 |

TABLE II-continued

| | Lattice Constants of Perovskites | | |
|---|---|---|---|
| Compound | a(Å) | b(Å) | c(Å) |
| LaScO$_3$ | 5.678 | 5.787 | 8.098 |

*Calculated values.

EXAMPLE D

Growth of Mixed Crystals to Attain a Specific Lattice Constant Match

This example relates to selecting a mixed crystal of the La$_{1-x}$R$_x$Ga$_{1-y}$Al$_y$O$_3$ type where R is a smaller rare earth ion such as Gd$^{3+}$ or Y$^{3+}$ in order to deposit a thin film of the YBa$_2$Cu$_3$O$_{7-x}$ compound on the (110) planes of a perovskite substrate and achieve the substantial lattice match of superconductor film and substrate. For YBa$_2$Cu$_3$O$_{7-x}$ the orthorhombic unit cell is a=3.856 Å, b=3.870 Å, and c=11.666 Å from T. Siegrist et al., Phys. Rev. B, 35 7137 (1987).

Since one lattice spacing d$_{110}$ of a substrate may not exactly match more than one spacing of the film, an approximate compromise for the film is chosen, e.g. an average between the a=3.856 Å and the b=3.870 Å or 3.863 Å. Thus, the design of substrate with a lattice spacing of 3.863 Å is now considered. This is done with the assistance of Table III below. The first five entries of Table III are measured orthorhombic lattice constants of pure phases of respective pervoskites. The last three entries are for proposed mixed crystal compositions which exactly satisfy the d$_{110}$ lattice spacing of the required 3.863 Å. In these calculations it is assumed that a nearly linear change of a, b, or c is occurring with composition. Thus, the actual measured a, b, and c of the mixed crystal may deviate slightly from these calculated values. Other examples of lattice match procedures are evident from the above discussion.

TABLE III

| | Lattice Constants of Perovskites | | | |
|---|---|---|---|---|
| | a | b | c | d 100 |
| LaAlO$_3$ | 5.356 | 5.356 | 7.600 | 3.787 |
| LaGaO$_3$ | 5.519 | 5.494 | 7.770 | 3.894 |
| LaScO$_3$ | 5.678 | 5.787 | 8.098 | 4.053 |
| GdGaO$_3$ | 5.537 | 5.322 | 7.606 | 3.837 |
| YGaO$_3$ | 5.536 | 5.257 | 7.533 | 3.812 |
| *LaAl$_{0.3}$Ga$_{0.7}$O$_3$ | 5.470 | 5.453 | 7.719 | 3.863 |
| *La$_{0.5}$Gd$_{0.5}$GaO$_3$ | 5.527 | 5.405 | 7.686 | 3.863 |
| *La$_{0.6}$Y$_{0.4}$GaO$_3$ | 5.528 | 5.387 | 7.628 | 3.863 |

*Calculated

In order to prepare these mixed single crystals, appropriate molar ratios of the respective oxides are incorporated into the melt prior to crystal growth. For example, to prepare the La$_{0.6}$Y$_{0.4}$GaO$_3$ composition, 0.6 mole of La$_2$O$_3$, 0.4 mole of Y$_2$O$_3$, and 1.0 mole of Ga$_2$O$_3$ can be introduced into the crucible. Some correction may have to be made for segregation, since k=Cs/Cl may not be exactly 1 for Gd, Y, or Al in LaGaO$_3$. Examples for other mixed crystals are treated similarly.

The substrates suitable for use in the present invention, such as LaGaO$_3$, in order to obtain a high quality film, have surfaces which are clean and free of dirt, grease, particles, inclusions, scratches, and subsurface damage. The desired surface is achieved during substrate preparation. The boule is ground, sliced and polished into wafers utilizing standard substrate preparation techniques; such procedure not being a part of the present invention. Prior to use of the wafer in the LPE process of the present invention, the substrate is cleaned further by chemical or physical cleaning by washing with anionic soaps, rinsing with filtered bacteria-free water followed by cleaning in oxygen plasma for several minutes.

In addition, the wafer surface must be flat and preferably oriented to ±0.25° of a specific crystal plane.

It is preferred that no inclusions, dislocations, twins and other defects which intersect the surface are present in the substrate.

Although the substrates of choice are monocrystalline or mixed monocrystalline lanthanum orthogallate, the substrate can be any perovskite-type monocrystalline substrate having a lattice constant substantially matching that of the deposited superconductor film.

Suitable perovskite-type substrates are $SrTiO_3$, $LaAlO_3$, $LiNbO_3$, $LiTaO_3$, $KTaO_3$, $LaGaO_3$, $LiBaF_3$ and others described by F. S. Galasso, "Structure, Properties, and Preparation of Perovskite Type Compounds," Pergamon Press, New York, 1969.

The term "perovskite" refers to the mineral of chemical composition $CaTiO_3$. As used herein, perovskite-type refers to the prototype crystal structure of $CaTiO_3$ or any related chemical compound of composition $ABC_3$ where A is large ion of valence 1-5 which is dodecahedrally coordinated, and B is a small ion of valence 5-1 and is octahedrally coordinated. The valence sum of A and B must equal 6 if C is oxygen, 3 if C is F, 3 if C is H.

The method of the present invention extends to the application of oxidic superconductors generally to substantially lattice matched monocrystalline substrates generally and is not limited to the perovskite (perovskite-type) monocrystalline substrates.

The method of the present invention finds application for the formation of oxide superconductor films, especially thin films of 1 um-10 um, on substantially lattice matched monocrystalline substrates in general, provided that the precursor oxides of the superconductor are formed into a melt comprising nutriment and flux and monocrystalline substrate is selected of appropriate architecture to substantially match the lattice of the oxidic superconductor film deposited by liquid phase epitaxy.

The oxidic superconductor films that can be formed in accordance with the present invention nominally can be designated as being perovskite-like or perovskite-related. As used herein, the terms "perovskite-like" or "perovskite-related" as defined by A. F. Wells in "Structural Inorganic Chemistry," Oxford University Press, London, 1962, p. 499, refer to those crystal structures which contain elements of the basic perovskite structure. For example, the $A_2BO_4$ structure can be derived from the $ABO_3$ perovskite unit by displacing slices of the latter. In general, any new structures which contain the basic octahedral oxygen and 9-12 coordinated A ions are perovskite-related. The new oxidic superconductors are examples of perovskites or perovskite-like structures, as noted by reference to examples thereof below:

$(LaBa)_2CuO_4$—perovskite-related, $A_2BO_4$
$BaPb_{1-x}Bi_xO_3$—perovskite-related, $ABO_3$
$YBa_2Cu_3O_7$—perovskite-related, $A_3B_2O_7$
$Bi_2Sr_2CaCu_2O_8$—perovskite-related, $A_5B_2O_8$

THE PREFERRED SUPERCONDUCTING FILM

The method of the present invention is particularly suitable for film growth of (1) the composition designated as $Bi_2Sr_2Ca_1Cu_2O_8$, called the (2212) phase from the composition subscripts and (2) the compositions designated $YBa_2Cu_3O_{7-x}$ composition called (123) type compounds. In addition, other films such as, e.g., $Tl_2Sr_2Ca_1Cu_2O_8$ can be grown by substitutions of ions which are of the same ionic radius and charge. Representative examples of oxidic superconductors suitable for film formation in accordance with the present invention are those having the formulations and structures reviewed in the paper of A. W. Sleight entitled "Chemistry of High-Temperature of Superconductors," Science, 242, 1519 (1988). For example, as shown in Table IV below, the following substitutions are among those contemplated:

TABLE IV

| Ion in Film Composition | Ionic Radius (A) | Other Possible Substitutions |
|---|---|---|
| $Bi^{3+}$ | 0.93 | Rare earths $La^{3+} - Lu^{3+}$ $Tl^{3+}$, $Y^{3+}$ |
| $Y^{3+}$ | 0.92 | $La^{3+} - Lu^{3+}$, $Tl^{3+}$ |
| $Ca^{2+}$ | 0.99 | $Sr^{2+}$ |
| $Sr^{2+}$ | 1.12 | $Ca^{2+}$, $Pb^{2+}$ |
| $Ba^{2+}$ | 1.34 | $Sr^{2+}$, $Ca^{2+}$, $Pb^{2+}$ |

The films formed in accordance with the method of the present invention can be defined as epitaxially grown, with near lattice constant match to single crystal substrate, with $LaGaO_3$ or mixed monocrystalline lanthanum orthogallate representing a preferred substrate. The films produced preferably are 0.1-10 μm thick. The films have high $T_c$ and are superconducting either as prepared or after annealing. As confirmed by X-ray analysis, the film compositions are the same phases which have been reported by other growth methods. The films are contiguous covering the entire surface of the substrate over the area of the substrates upon which they are grown typically wafers of 1 inch diameter but varying depending on ultimate use from wafers of smaller diameter to diameters of 3 inches, the size of same not being critical to the present invention. The preferred orientation of the 2212 compound is that (001) planes of the film parallel the (001) substrate planes. In the case of the 123 compound the (001) orientation of the film is parallel to the (001) or (110) orientation of the substrate planes.

In the preparations of the melt, the film-forming components are conveniently formed from commercially available oxide starting materials. However, in certain cases it is preferable to use the carbonate ($CaCO_3$), nitrate ($Sr(NO_3)_2$), hydroxide ($Ba(OH)_2$) to obtain the final composition. In most cases the latter compounds decompose to the oxide at low enough temperatures so that the oxide is the stable reactive phase. In this way, the use of oxide compounds that are hygroscopic (at 25° C.) and which may adsorb enough water to adversely affect the final compositions is avoided.

Single alkali halides such as KCl or other salts, mixed systems, such as KCl-KF, and other halides, such as $BaF_2$, $PbF_2$, $BiF_3$ have been known as solvents for oxides for many years. Alkali halides, in particular KCl, have been found to be satisfactory solvents for the 2212 compound and can be removed from an epitaxial film of such compound by washing in water. KCl is soluble in water. The 2212 compound is insoluble in water and does not decompose in or react with water.

The $YBa_2Cu_3O_{7-x}$ or 123 compound is very reactive with water and separation of the 123 compound film from KCl solvent must be effected in the absence of water.

When forming films of superconductors, such as the class Tl containing compounds, analogous to the Bi series in their properties, the growth of such compounds from a KCl flux in accordance with the present invention must be effected with caution because of toxicity problems associated with Tl.

THE REQUIREMENT OF SUBSTANTIALLY MATCHING THE SUBSTRATE AND OXIDE SUPERCONDUCTOR FILM FORMED USING LIQUID PHASE EPITAXY

Based on observation of deposition of oxidic superconductors on single crystal substrates, the requirement for substantially matching the lattice of oxide superconductor films formed from a melt can be expressed as a multiple of the formula:

$$a_o \text{ sub} - a_o \text{ film} \leq \frac{0.03}{\sqrt{h}}$$

where $a_o$ sub is the lattice constant for the substrate and $a_o$ film is the lattice constant for the film both expressed in Angstrom units. The thickness of the film is h expressed in microns. This formula approximation for the tolerable limit of lattice constant mismatch between the substrate and film grown epitaxially on the substrate was developed for rare earth-iron oxide garnet films (Ref.: *Magnetic Bubble Technology*, A. H. Eschenfelder, Springer-Verlag, Barhn, Heidelberg, N.Y.). The formula represents a convenient rule of thumb for determining the required architecture of oxidic superconductor and substrate at their interface when thin film oxide superconductors are formed on monocrystalline substrates using the liquid phase epitaxy method of the present invention. The utility of this rule is in estimating how thick a film can be grown with an existing lattice mismatch defined by the lattice constant of the superconducting film and the lattice constant for a monocrystalline substrate, in particular the various rare earth orthogallates or substituted rare earth orthogallates. A thin film can tolerate a larger amount of lattice mismatch, as can be seen by an examination of the formula for lattice mismatch. This is because a thin film can elastically expand or contract as needed to match the size of the substrate to which it is epitaxially attached, atom by atom to the substrate below it. As an example, the a and b lattice constant for the (001) oriented $YBa_2Cu_3O_{7-x}$ superconductor film is 3.820 Å and 3.892 Å respectively. The a and b lattice constants of the substrate, here the (001) oriented $LaGaO_3$, are 3.894 Å and 3.894 Å. The worst mismatch case is the a lattice constant of the film and the a or b lattice constant of the substrate. Here the rule predicts:

$$3.894 - 3.820 \leq \frac{0.03}{\sqrt{h}} \quad h = 0.16 \, \mu m$$

The rule predicts a 0.16 um film of (001) oriented $YBu_2Cu_3O_{7-x}$ can be grown on the (001) oriented $LaGaO_3$ substrate with an acceptable and fully tolerable amount of lattice strain due to lattice mismatch between the film and substrate. As mentioned earlier, this rule of thumb is fairly conservative and can be doubled with just a little loss in film quality due to increased lattice strain. If a (001) oriented $NdGaO_3$ substrate was chosen (see Table I) with a lattice constant = 3.865 and a b lattice constant = 3.855 Å, a thicker (001) oriented $YBa_2Cu_3O_{7-x}$ film could be grown on it. From the rule of thumb for the worst lattice mismatch case of a lattice constant of the film = 3.820 Å and a lattice constant of the substrate = 3.865 Å the rule predicts:

$$3.865 - 3.820 \leq \frac{0.03}{\sqrt{h}} \quad h = 0.44 \, \mu m$$

a 0.44 μm film with fully acceptable strain level and a 0.88 μm film with a slight loss in film quality due to residual strain. For the formation of oxidic superconducting films from 0.1 to 10 μm in thickness, the foregoing combinations of films and substrate are suitable. For thicker films, even smaller lattice constant substrates as $La_1Gd_{1-x}GaO_3$ and $LaGa_{1-x}Al_xO_3$ preferably are chosen. By controlling the amount of smaller ionic radius Gd to $La_1Gd_{1-x}GaO_3$ and smaller ionic radius Al to $LaGa_1Al_{1-x}O_3$ the lattice constant of the substrate can be tailored to match the lattice constant of the film.

THE CRITERIA FOR FORMULATING THE MELT COMPONENTS (FLUX AND NUTRIMENT)

Three criteria are required for the growth of oxidic superconductors epitaxial films on substantially lattice matched monocrystalline substrate. First, the single crystal substrates must be of the same or related crystal structure to the film formed thereon. The term "same" crystal structure, when applied to film and substrate, means that the two crystal structures are identical types, for example:

garnet film on garnet substrate
perovskite film on perovskite substrate
rock salt film on rock salt substrate The term "related" crystal structure, when applied to film on substrate, means that the two structures are not identical, but certain features of one may be found in the other, for example:

| GaAs film | on | silicon substrate |
| zinc blend | | diamond-type |
| perovskite-like | on | perovskite |
| $CdCl_2$ | on | NaCl |
| layer | | rock salt |

Second, the melt from which the films are grown must be capable of dissolving the oxide components which make up the film at some practical evaluated temperature. Usually 1200° C. is the upper limit to limit problems with flux volatility at higher temperatures. Secondly, the melt must exhibit as its primary phase field region the composition of the film to be grown. That is, upon cooling the melt from its elevated temperature, the phase that crystallizes from the melt must be the superconducting film composition. That and only that phase can be allowed to precipitate. If a secondary phase also crystallizes from the melt during film formation, the secondary phase will get entrapped in the film during growth and seriously degrade physical and electrical properties of the film formed.

The presence of secondary phases can be detected by an X-ray diffraction analysis of the grown film. These secondary phases are avoided by selecting a melt composition and/or growth temperature where only one phase exists.

As an example, early work on the KCl fluxed melts for growing $Bi_2Sr_2CaCu_2O_8$ used a composition (see below) containing

| | |
|---|---|
| $Bi_2O_3$ | 4.8 wt % |
| $SrCO_3$ | 1.8 |
| $CaCO_3$ | 2.8 |
| CuO | 1.2 |
| KCl | 89.4 | a high level of KCl flux. Such a high level of flux makes for a low melting, fluid flux ideal for LPE growth. However, $Bi_2Sr_2Cu_1O_x$ which superconducts at an unacceptable 10° K., was found as a second phase. This phase could not be eliminated by adjusting the composition of the nutrient component of the melt. Only by lowering the KCl flux to the 10-20% level could this second phase be avoided. Another example is the melt composition given below:

| | |
|---|---|
| $Bi_2O_3$ | 39.0 wt % |
| $CaCO_3$ | 12.5 |
| $SrCO_3$ | 18.3 |
| CuO | 13.2 |
| KCl | 17.0 | which yields the $Bi_2Sr_2Ca_1Cu_2O_8$ compound as the primary phase field in the temperature range of 920° to 860° C. Above 920° C. a second phase grows from the melt simultaneously with the desired $Bi_2Sr_2CaCu_2O_8$ phase.

The third melt requirement is that the melt must be fluid in order to allow crystal growth to occur without being limited by mass flow. As noted previously, two other investigators have worked in what they term liquid phase epitaxial growth of $YBa_2Cu_3O_{7-x}$ and $Bi_2Sr_2Ca_1Cu_2O_8$ film (ref. papers F5.121 by A. S. Yue and C. S. Yang and paper F5.122 by Y. T. Huang, R. S. Liu, J. J. Chu and P. T. Wu both papers presented at the 1988 fall meeting of The Materials Research Society, Nov. 28-Dec. 3, 1988 in Boston, Mass.). This previous growth method differs from the method of the present invention in that Huang et al. used no flux to liquify the viscous melt. In the Huang et al. method, substrates were placed in very viscous pastes of $Y_2O_3$-BaO —$Cu_2O$ in the case of the growth of $YBa_2Cu_3O_{7-x}$ and $Bi_2O_3$-$SrO_2$-CaO-$Cu_2O$ pastes in the case of the growth of $Bi_2Sr_2Ca_1Cu_2O_8$. As the pastes were cooled, some epitaxial growth occurred but these techniques are not adaptable to the growth of high quality films. In addition, these investigators used MgO substrates that are neither lattice matched nor even of the same crystal structure. Their epitaxial growth therefore was limited to very small pieces circa 100 um on a side. Extensive cracking of thin films resulted from the use of inappropriate substrates.

The method of the present invention allows for the first time, the true epitaxial growth of superconductors from fluid (circa 1 centipoise viscosity) fluxed melts, where, as noted, the primary phase field region is the superconductor compound and no other phase precipitates. Further in this regard, because of the fluidity of the flux melt, residual fluxes can be removed from the films by rapid spinning.

The exact process by which the flux is removed from the grown film is as follows. The substrate onto which the film is grown is held horizontally in the melt by a platinum holder. Great care is made to ensure the holder spins about its axis of rotation without undue wobbling. After the growth is completed, the holder and attached substrate is pulled out of the melt just far enough to clear the melt surface. Because the substrate is mounted at a 5° angle off the horizontal, the flux tends to roll off the film at this elevated temperature (circa 850°-1000° C.). A residual flux bead remains at the edge of the film due to surface tension and partial wetting of the film by the flux. At this point, the holder is rapidly rotated (circa 800 rpm) and the flux is thrown off the film due to centrifugal action. The spun-off flux is caught by the walls of the crucible and flows back down into the melt. The criteria for determining if the flux has been adequately removed from the film is by optical examination.

The removal of flux is an essential step in the growth of epitaxial films of oxidic superconductors in accordance with the method of the present invention allowing for growth at enhanced rate by virtue of liquid phase epitaxy.

KCl has been shown to be an acceptable flux for the growth of $YBa_2Cu_3O_{7-x}$ and $Bi_2Sr_2Ca_1Cu_2O_8$ films by liquid phase epitaxy. The fluxes provide a fluid melt, do not enter into the structure of the films, provide a non-wetting melt (required for the removal by spinning) and provide the appropriate primary phase field region on cooling. KCl up to 20% has been shown to provide a single phase primary phase field region. KCl fluxes in the 85-90% range have been investigated. KCl fluxes in the 85-90% however produce a two-phase primary phase filed region containing the desired $Bi_2Sr_2Ca_1$-$Cu_2O_8$ phase and an additional $Bi_2Sr_2Cu_1O_x$ phase which exhibits a $T_c$ of only 10° K. It has been found that both phase grow simultaneously on $LaGaO_3$ substrates providing a film with a mixture of phases, i.e., $Bi_2Sr_2Ca_1Cu_2O_8$ and $Bi_2Sr_2Cu_1O_x$. The exact maximum level of KCl flux to provide a single primary phase field region is unknown but is probably in the 40 to 50 wt % level. Due to similarities in the high temperature solution properties of the alkali halides, it is believed that any of the alkali halides in the 5 to 50% range will work as fluxes for the liquid phase epitaxy of superconducting compounds.

Other traditional fluxes used in liquid phase epitaxy and in the solution growth of crystals have been evaluated. Fluxes such as $Bi_2O_3$, PbO, $V_2O_5$ and $Li_2MoO_4$ were extensively studied but they failed to provide a superconducting film as the primary phase field. Although not wishing to be bound, it is believed that an alkali halide flux may work due to the similarity of the melting point of such flux with the nutriment melting point and the ability of such flux to dissolve inorganic oxides.

In accordance with the present invention, a non-oxide flux is used because non-oxide fluxes, unlike the oxide fluxes, do not have the tendency to form common compounds with the oxide nutrient in the melt, but rather stay in solution at the growth temperature of the superconducting compounds. Alkali halides and particularly alkali chlorides are preferred fluxes. Alkali halide fluxes may contain a mixture of alkali halides. The alkali halide most preferred is KCl. Here again, mixtures of alkali fluorides are suitable. The most preferred alkali halide fluxes are comprised of potassium and sodium chloride and mixtures thereof.

It has been found that the use as flux of compounds that are present in the desired phase, so the flux is a partial self flux, is unsatisfactory.

In accordance with the present invention, fluxes that are not a part of the compound to be grown are selected. In order to prevent the unwanted uptake of flux into the film, flux compounds that have the same cation oxidation state or ionic size as the elements in the film to be grown should be avoided. For example, for the compound $Bi_2Sr_2CaCu_2O_8$, 3+ and 2+ oxidation states should be avoided. This leaves 4+ or 1+ compounds. One generic class of 1+ compounds is the alkali halide class. Alkali chlorides are the salts of choice as they are generally very water soluble and low melting. This is important as the $Bi_2Sr_2CaCu_2O_8$ compound is not attacked by water. This leaves water as a suitable solvent for removing residual flux should a rapid spin-off method prove unsuitable. The alkali fluorides are a good second choice, although many of them are difficult to remove with acids. This would make crucible clean-up difficult, although not impossible, because HF acid or other water soluble fluorides could be used as a clean-up solvent.

To evaluate the suitability of a flux, the first step in the protocol requires that it be determined if the superconductor compound exists as a primary phase. That is, upon cooling from the molten state, whether the superconductor compound, and only that compound, precipitates out of solution. During LPE growth, the selection of a substantially lattice matched substrate and controlled cooling prevents spontaneous precipitation. The growth on a substrate "seed" is energetically favored over homogeneous nucleation (precipitation). For the case of the $Bi_2Sr_2CaCu_2O_8$ film, there are six variables to vary in a search for the primary phase field region. One variable for each oxide in the film plus one for the flux and one for the growth temperature. A systematic study is undertaken to make up small melts of all reasonable combinations of the nutrient oxides and fluxes. At first, the temperature variable is not considered. Melts are made up in platinum crucibles, melted and slow cooled to room temperature so that crystals of the different crystalline phases crystallize out and settle to the bottom of the crucible. These crystals are mechanically, chemically or thermally separated from the flux and analyzed by X-ray diffraction to determine their crystalline phase. If at least some of the desired phase appears, that composition is made up as a larger melt (circa 500 g) and epitaxial growth attempted with lattice matched $LaGaO_3$ substrates at various growth temperature. At a suitable temperature, epitaxial growth occurs and this can be confirmed by an X-ray diffraction analysis of the film on the substrate. The composition of the melt is then fine tuned to produce a temperature and melt composition region where only the desired phase grows on the substrate. It is an essential feature of the present invention that the flux does not form compounds in the melt between the flux and any nutriment component at the growth temperature.

Preferably, the flux forms an eutectic mixture with each of the oxide components of the films and the solubility of the nutriment components preferably is greater than 1% based on the total weight of the melt. The viscosity of the melt at growth temperature is preferably from about 0.5 to about 10 centipoise, with a viscosity of about 1 generally providing good results. It is also most preferred that the vapor pressure of the melt should be less than 10 mm of Mercury.

LPE GROWTH RATE OF THE PRESENT INVENTION COMPARED WITH SPUTTERING

LPE growth rate, in accordance with the present invention, is capable of reaching 1 $\mu$m/minute. The rate is governed by the high supersaturations attainable in liquid solvent systems at growth temperatures. Sputtering, on the other hand, is always done in vacuum or at low partial pressures of gases. The nature of the process thus is always growth of a film at extremely low supersaturations. As a result, film growth by sputtering is typically 100–1000 times slower than from the solutions contemplated by the method of the present invention.

The following examples illustrate the method of oxidic superconductor film formation from solution in accordance with the present invention.

EXAMPLE I

Growth of $Bi_2Sr_2Ca_1Cu_2O_8$ on monocrystalline $LaGaO_3$

A melt of composition given in Table V for $Bi_2Sr_2Ca_1Cu_2O_8$ was prepared by blending all the components other than KCl in a two inch diameter covered platinum crucible and sintering the blend in air at about 850° C. to decompose the carbonates and to reduce the volume of the starting material. KCl was then added and the temperature of the melt was then raised to 1000° C. and held at that temperature for one hour to homogenize the melt. The melt was then lowered to the growth temperature in preparation for epitaxial growth. The lid from the crucible was removed and platinum heat flow baffles were installed in the furnace to control the thermal gradients in the furnace.

While the melt was cooling to the desired growth temperature, a one inch diameter wafer of $LaGaO_3$ (001) oriented and about 0.020 inches in thickness is mounted for growth of a film thereon in a platinum-gold alloy holder. The holder was designed to hold the substrate horizontally in the melt by gripping the edge of the substrate in 3 places. Prior to growth, the substrate and holder are cleaned of all particulates and organic films. The holder and substrate are cleaned in a flowing oxygen plasma for several minutes to remove difficult-to-eradicate contaminants such as human skin oils. The organic contamination was oxidized to $CO_2$ gas and swept off the substrate by flowing oxygen gas.

When the furnace has cooled to the growth temperature, the substrate is held over the melt for 10 minutes to warm up before dipping into the melt for epitaxial growth.

At 921° C. the substrate was dipped into the melt and rotated back and forth at 100 rpm with a reversal occurring every 8 seconds. Concomitantly the furnace is cooled from 921° C. to 912° C. over the 15 min. growth period. After the growth period, the substrate was pulled up just far enough to clear the upper surface of the melt by ½ inch and spun off unidirectionally at 500 rpm for 10 seconds. The film was then slowly pulled out of the furnace at the rate of 1 inch/min. Small traces of KCl flux, which could be seen by visual examination, were completely removed by a 5 second dip in 80° C. deionized water. The film was examined by X-ray diffraction analysis (Ref. J. M. Tarascon et al., Phys. Rev. B., 37, 9382, 1988) to confirm the correct phase and orientation and surface profilometry to determine the thickness. Under these conditions, the film thickness was 5 μm. The $T_c$ was measured by a 4 point probe and the film was found to superconduct at 85° K.

TABLE V $Bi_2Sr_2Ca_1Cu_2O_8$
Compositional Range of Melt

| | Wt. % |
|---|---|
| $Bi_2O_3$ | 39.1 |
| $CaCO_3$ | 12.5 |
| CuO | 13.2 |
| $SrCO_3$ | 18.4 |
| KCl | 16.8 |

EXAMPLE II

Growth of $Bi_2Sr_2Ca_1Cu_2O_8$ on (001) oriented $GdGaO_3$

Following the same procedure set forth in Example I, a (001) oriented $GdGaO_3$ substrate is substituted in place of the $LaGaO_3$ substrate used in Example I. A superconductor film of correct phase and orientation is produced.

EXAMPLE III

Growth of $Bi_2Sr_2Ca_1Cu_2O_8$ on (001) oriented $LaGa_{1-x}Al_xO_3$ where x is 0.01

Following the same procedure set forth in Example I, a (001) oriented $LaGa_{0.99}Al_{0.01}O_3$ substrate is substituted in place of the $LaGaO_3$ substrate used in Example I. A superconductor film of correct phase and orientation is produced.

EXAMPLE IV

Growth of $Bi_2Sr_2Ca_1Cu_2O_8$ on (001) oriented $La_{1-x}Gd_xGaO_3$ where x is 0.05–0.10

Following the same procedure set forth in Example I, (001) oriented $La_{1-x}Gd_xO_3$ substrates, wherein x has values within the range of from 0.05–0.10, are substituted in place of the $LaGaO_3$ substrate of Example I. The resulting films formed on the substrates are of correct phase and orientation. Measurement of $T_c$ by a 4 point probe indicated the film to superconduct at about 85° K.

EXAMPLE V

Growth of $YBa_2Cu_3O_7$ on monocrystalline (001) oriented $LaGaO_3$

A melt of composition given in Table VI for $YBa_2Cu_3O_7$ was prepared by blending all the components other than KCl in a covered platinum crucible of 2 inch diameter and sintering the blend in air at about 850° C. to decompose the carbonates and to reduce the volume of the starting material. KCl was then added and the temperature then raised to about 1050° C.–1080° C. and the melt temperature is then lowered to a growth temperature of 1047° C. in preparation for epitaxial growth. The lid from the crucible was removed and platinum heat flow baffles are installed in the furnace to control the thermal gradients in the furnace.

While the melt was cooled to the desired growth temperature, a one inch diameter and 0.020 inch thick (001) oriented $LaGaO_3$ wafer was mounted for growth in a platinum-gold alloy holder. The holder was designed to hold the substrate horizontally in the melt by gripping the edge of the substrate in 3 places. Prior to growth, the substrate and holder were cleaned of all particulates and organic films. Due to the solubility of rare earth orthogallates in mineral acids, the usual 3:1 $H_2SO_4:H_2O_2$ etch for removing organic contamination typically used could not be used. Instead, the holder and substrate were cleaned in a flowing oxygen plasma for several minutes to remove difficult-to-eradicate contaminants such as human skin oils. The organic contamination was oxidized to $CO_2$ gas and swept off the substrate by flowing oxygen gas.

The furnace was cooled to a growth temperature of 1047° C. and the substrate was held over the melt for 10 minutes to warm up before dipping into the melt for epitaxial growth. Once dipped, the substrate was rotated back and forth at a rate of 100 rpm with a 5 second reversal rate. A growth run of 15 minutes was used.

During the 15 minute growth run, the temperature of the melt was slowly lowered from 1047° C. to 1041° C. After growth, the holder was extracted from the melt and, while still at the growth temperature, rotated at 1000 rpm for 10 sec. to spin off the residual melt clinging to the film. In the case of $YBa_2Cu_3O_7$ the flux must be totally removed by spinning, as these films decompose in most solvents. After growth, the film was examined by X-ray diffraction and found to be (001) oriented $YBa_2Cu_3O_{7-x}$. The as-grown film at this point was not superconducting and was annealed in $O_2$ to make it superconducting.

The resulting film or substrate was annealed at 950° C. in an oxygen atmosphere for three hours and then slowly cooled to below 700° C. in 10 hours.

The $T_c$ was measured by 4 point probe method and was found to superconduct at 90° K. The film when measured by a profilometer was found to be 1 μm thick.

TABLE VI $YBa_2Cu_3O_7$
Compositional Range of Melt

| | Wt. % |
|---|---|
| $BaCO_3$ | 56.6 |
| $Y_2O_3$ | 2.7 |
| CuO | 35.8 |
| KCl | 4.9 |

EXAMPLE VI

Growth of $YBa_2Cu_3O_7$ on monocrystalline (110) oriented $LaGaO_3$

A melt of composition given in Table VII for $YBa_2Cu_3O_7$ was prepared by blending all the components other than KCl in a covered platinum crucible of 2 inch diameter and sintering the blend in air at about 850° C. to decompose the carbonates and to reduce the volume of the starting material. KCl was then added and the temperature then raised to about 1050° C.–1080° C. and the melt temperature is then lowered to a growth temperature of 1047° C. in preparation for epitaxial growth. The lid from the crucible was removed and platinum heat flow baffles are installed in the furnace to control the thermal gradients in the furnace.

While the melt was cooled to the desired growth temperature, a one inch diameter and 0.020 inch thick (001) oriented $LaGaO_3$ wafer was mounted for growth in a platinum-gold alloy holder. The holder was designed to hold the substrate horizontally in the melt by gripping the edge of the substrate in 3 places. Prior to growth, the substrate and holder were cleaned of all particulates and organic films. Due to the solubility of rare earth orthogallates in mineral acids, the usual 3:1 $H_2SO_4:H_2O_2$ etch for removing organic contamination typically used could not be used. Instead, the holder and substrate were cleaned in a flowing oxygen plasma for several minutes to remove difficult-to-eradicate contaminants such as human skin oils. The organic contamination was oxidized to $CO_2$ gas and swept off the substrate by flowing oxygen gas.

The furnace was cooled to a growth temperature of 1047° C. and the substrate was held over the melt for 10 minutes to warm up before dipping into the melt for epitaxial growth. Once dipped, the substrate was rotated back and forth at a rate of 100 rpm with a 5 second reversal rate. A growth run of 15 minutes was used.

During the 15 minute growth run, the temperature of the melt was slowly lowered from 1047° C. to 1041° C. After growth, the holder was extracted from the melt and, while still at the growth temperature, rotated at 1000 rpm for 10 sec. to spin off the residual melt clinging to the film. In the case of $YBa_2Cu_3O_7$ the flux must be totally removed by spinning, as these films decompose in most solvents. After growth, the film was examined by X-ray diffraction and found to be (001) oriented $YBa_2Cu_3O_x$. The as grown film at this point was not superconducting and was annealed in $O_2$ to make it superconducting.

The resulting film or substrate was annealed at 950° C. in an oxygen atmosphere for three hours and then slowly cooled to below 700° C. in 10 hours.

The $T_c$ was measured by 4 point probe method and was found to superconduct at 90° K. The film when measured by a profilometer was found to be 1 $\mu$m thick.

TABLE VII $YBa_2Cu_3O_7$
Compositional Range of Melt

|  | Wt. % |
|---|---|
| $BaCO_3$ | 56.6 |
| $Y_2O_3$ | 2.7 |
| CuO | 35.8 |
| KCl | 4.9 |

EXAMPLE VII

Growth of $YBa_2Cu_3O_7$ on (001) oriented $LaGa_{1-x}Al_xO_3$ where x is 0.01

Following the same procedure set forth in Example V, a (001) oriented wafer of $LaGa_{0.99}Al_{0.01}O_3$ is substituted in place of the (001) oriented $LaGaO_3$ wafer of Example V. A superconductor film of correct phase and orientation is produced.

EXAMPLE VIII

Growth of $YBa_2Cu_3O_7$ on (001) oriented $La_{1-x}Gd_xGaO_3$ where x is 0.05–0.10.

Following the same procedure set forth in Example V, (001) oriented $La_{1-1}Gd_xO_3$ substrate wherein x has values within the range of from 0.05–0.10, are substituted in place of the $LaGaO_3$ substrate of Example V. A superconductor film of correct phase and orientation is produced.

EXAMPLE IX

Growth of $Bi_2Sr_2Ca_1Cu_2O_8$ on (001) oriented $NdGaO_3$.

Following the same procedure set forth in Example I, a $NdGaO_3$ substrate is substituted in place of the $LaGaO_3$ substrate used in Example I. A superconductor film of correct phase and orientation is produced.

EXAMPLE X

Growth of $Tl_2Ba_2CaCu_2O_8$ on monocrystalline $LaGaO_3$

A melt of composition given in Table VIII for $Tl_2Ba_2CaCu_2O_8$ is prepared by blending all the components other than KCl in a two inch diameter covered platinum crucible and sintering the blend in air at about 850° C. to decompose the carbonates and to reduce the volume of the starting material. KCl is then added and the temperature of the melt is then raised to 1000° C. and held at that temperature for one hour to homogenize the melt. The melt is then lowered to the growth temperatures given in Table VIII in preparation for epitaxial growth. The lid from the crucible is removed and platinum heat flow baffles are installed in the furnace to control the thermal gradients in the furnace.

While the melt is cooling to the desired growth temperature, a substrate one inch in diameter $LaGaO_3$ or (001) or (110) oriented and 0.020 inch thick is mounted for growth in a platinum-gold alloy holder. The holder is designed to hold the substrate horizontally in the melt by gripping the edge of the substrate in 3 places. Prior to growth, the substrate and holder are cleaned of all particulates and organic films. The holder and substrate are cleaned in a flowing oxygen plasma for several minutes to remove difficult-to-eradicate contaminants such as human skin oils. The organic contamination is oxidized to $CO_2$ gas and swept off the substrate by flowing oxygen gas.

When the furnace has cooled to the growth temperature, the substrate is held over the melt for 10 minutes to warm up before dipping into the melt for epitaxial growth. Once dipped, the substrate is rotated back and forth at a rate between 25 and 150 rpm with a 2–10 second reversal rate. The exact rotation schedule is not critical as long as adequate mixing occurs. The growth times range from 2 minutes to $\frac{1}{2}$ hour depending on desired thickness. The growth rate at the conditions stated below is from about 0.1 $\mu$m to 1 $\mu$m per minute depending on the rate of cooling of the melt.

During growth, the temperature of the melt is slowly lowered at a rate between 0.1 and 1° C./min. while growth occurs. After growth, the holder is extracted from the melt and, while still at the growth temperature, rotated at 1000 rpm to spin off residual melt. Small traces of KCl flux in the case of $Tl_2Ba_2CaCu_2O_8$ films can be removed by dipping momentarily in boiling deionized water.

TABLE VIII $Tl_2Ba_2CaCu_2O_8$
Compositional Range of Melt

|  | Wt. % |
|---|---|
| $Tl_2O_3$ | 58.0 |
| $BaCO_3$ | 18.3 |
| $CaCO_3$ | 9.3 |
| CuO | 9.9 |
| KCl | 4.7 |

| Growth Temperature | |
|---|---|
| Optimal | *862–870° C. |
| Preferred | 862–880° C. |
| Operable | 862–921° C. |

*Growth at cooler temperatures results in less flux adhesion to films

We claim:

1. In a method of forming an epitaxial layer of an oxidic high $T_c$ superconductor on a substantially lattice matched monocrystalline substrate the improvement which comprises:
   a) forming a melt wherein the primary phase to crystallize out on cooling of the melt to effect film growth is the phase of the high $T_c$ oxidic superconductor, said melt comprising a nutriment composed of oxides of each element of said oxidic superconductor and a non-oxidic flux for said oxides;
   b) introducing the substrate into the melt; and
   c) cooling the melt to deposit an epitaxial layer of oxidic superconductor on said substrate.

2. The method of claim 1, wherein the flux is an alkali halide.

3. The method of claim 2, wherein the flux is comprised of an alkali halide selected from the group consisting of KCl, KF, NaCl, NaF and combinations thereof.

4. The method of claim 3, wherein the alkali halide is KCl.

5. The method of claim 1, wherein the melt is inert to Platinum, non-wetting and has a viscosity of about 0.5 to about 10 centipoise measured at growth temperature.

6. The method of claim 2, wherein the melt is inert to Platinum, non-wetting and has a viscosity of about 0.5 to about 10 centipoise measured at growth temperature.

7. The method of claim 3, wherein the melt is inert to Platinum, non-wetting and has a viscosity of about 0.5 to about 10 centipoise measured at growth temperature.

8. The method of claim 4, wherein the melt is inert to Platinum, non-wetting and has a viscosity of about 0.5 to about 10 centipoise measured at growth temperature.

9. The method of claim 1, wherein the oxidic superconductor is a 123 superconductor or a 2212 superconductor.

10. The method of claim 2, wherein the oxidic superconductor is a 123 superconductor or a 2212 superconductor.

11. The method of claim 3, wherein the oxidic superconductor is a 123 superconductor or a 2212 superconductor.

12. The method of claim 4, wherein the oxidic superconductor is a 123 superconductor or a 2212 superconductor.

13. The method of claim 5, wherein the oxidic superconductor is a 123 superconductor or a 2212 superconductor.

14. The method of claim 6, wherein the oxidic superconductor is a 123 superconductor or a 2212 superconductor.

15. The method of claim 7, wherein the oxidic superconductor is a 123 superconductor or a 2212 superconductor.

16. The method of claim 8, wherein the oxidic superconductor is a 123 superconductor or a 2212 superconductor.

17. In a method of forming an epitaxial layer of an oxidic perovskite-related superconductor on a substantially lattice matched monocrystalline perovskite-type substrate, the improvement which comprises:
   a) forming a melt wherein the primary phase to crystallize out of the cooling of the melt to effect film growth is the phase of the high $T_c$ oxidic superconductor, said melt comprising a nutriment composed of oxides of each element of said oxidic superconductor and a non-oxidic flux for said oxides;
   b) immersing the substrate into the melt;
   c) cooling the melt to form a film consisting essentially of said oxidic superconductor on a surface of the substrate;
   d) withdrawing the substrate from the melt, said substrate having an epitaxial film of oxidic superconductor formed thereon and said film having a residue of flux thereon; and,
   e) removing said residue of flux from said film.

18. The method of claim 17, wherein the flux is comprised of an alkali halide selected from the group consisting of KCl, KF, NaCl, NaF and combinations thereof.

19. The method of claim 18, wherein the alkali halide is KCl of KF.

20. The method of claim 17, wherein the substrate is an orthogallate.

21. The method of claim 18, wherein the substrate is an orthogallate.

22. The method of claim 19, wherein the substrate is an orthogallate.

23. The method of claim 20, wherein the orthogallate is a rare earth orthogallate.

24. The method of claim 21, wherein the orthogallate is a rare earth orthogallate.

25. The method of claim 22, wherein the orthogallate is a rare earth orthogallate.

26. The method of claim 23, wherein the rare earth orthogallate is lanthanum orthogallate.

27. The method of claim 24, wherein the rare earth orthogallate is lanthanum orthogallate.

28. The method of claim 25, wherein the rare earth orthogallate is lanthanum orthogallate.

29. The method of claim 23, wherein the rare earth orthogallate is a rare earth orthogallate of the following formula:

$$R_xLa_{1-x}GaO_3$$

wherein R is a rare earth element of smaller ionic radius than La and wherein x has a value of from 0.001 to 0.5.

30. The method of claim 24, wherein the rare earth orthogallate is a rare earth orthogallate of the following formula:

$$R_xLa_{1-x}GaO_3$$

wherein R is a rare earth element of smaller ionic radius than La and wherein x has a value of from 0.001 to 0.5.

31. The method of claim 25, wherein the rare earth orthogallate is a rare earth orthogallate of the following formula:

$$R_xLa_{1-x}GaO_3$$

wherein R is a rare earth element of smaller ionic radius than La and wherein x has a value of from 0.001 to 0.5.

32. A melt for liquid phase epitaxial growth of High $T_c$ oxidic superconductor film on a substantially lattice matched substrate comprising:
   a) nutriment comprised of oxides of each element of the oxidic superconductor; and
   b) a flux which does not react with any of the oxides at the growth temperature of the oxidic film, wherein the primary phase to crystallize out on cooling of the melt to effect film growth is the phase of the High $T_c$ oxidic superconductor.

33. The melt of claim 32, wherein the flux is an alkali halide.

34. The melt of claim 33, wherein the alkali halide is selected from the group consisting of KCl, KF, NaCl, NaF and mixtures thereof.

35. The melt of claim 34, wherein the alkali halide is KF or KCl.

36. The melt of claim 35, wherein the alkali halide is KCl.

37. The melt of claim 35, wherein the alkali halide is KF.

38. The method of claim 5 wherein the non-oxidic flux is present in an amount of from about 5% to about 50% by weight based on the combined weight of nutrient and flux.

39. The method of claim 6 wherein the non-oxidic flux is present in an amount of from about 5% to about 50% by weight based on the combined weight of nutrient and flux.

40. The method of claim 7 wherein the non-oxidic flux is present in an amount of from about 5% to about 50% by weight based on the combined weight of nutrient and flux.

41. The method of claim 8 wherein the non-oxidic flux is present in an amount of from about 5% to about 50% by weight based on the combined weight of nutrient and flux.

42. The method of claim 5 wherein the non-oxidic flux is present in an amount of up to about 20% by weight based on the combined weight of nutrient and flux.

43. The method of claim 6 wherein the non-oxidic flux is present in an amount of up to about 20% by weight based on the combined weight of nutrient and flux.

44. The method of claim 7 wherein the non-oxidic flux is present in an amount of up to about 20% by weight based on the combined weight of nutrient and flux.

45. The method of claim 8 wherein the non-oxidic flux is present in an amount of up to about 20% by weight based on the combined weight of nutrient and flux.

* * * * *